United States Patent
Woo et al.

(10) Patent No.: US 6,451,693 B1
(45) Date of Patent: Sep. 17, 2002

(54) DOUBLE SILICIDE FORMATION IN POLYSICON GATE WITHOUT SILICIDE IN SOURCE/DRAIN EXTENSIONS

(75) Inventors: Christy Mei-Chu Woo, Cupertino; George Jonathan Kluth, Sunnyvale; Qi Xiang, San Jose, all of CA (US)

(73) Assignee: Advanced Micro Device, Inc., Sunnyvale, CA (US)

( * ) Notice: Subject to any disclaimer, the term of this patent is extended or adjusted under 35 U.S.C. 154(b) by 0 days.

(21) Appl. No.: 09/679,370

(22) Filed: Oct. 5, 2000

(51) Int. Cl.[7] ............................................... H01L 21/44
(52) U.S. Cl. ...................... 438/682; 438/652; 438/655; 438/664; 438/683
(58) Field of Search .............................. 438/682, 683, 438/655, 652, 654

(56) References Cited

U.S. PATENT DOCUMENTS

| | | | | |
|---|---|---|---|---|
| 4,877,755 A | * | 10/1989 | Rodder | 438/586 |
| 5,322,809 A | * | 6/1994 | Moslehi | 438/303 |
| 5,723,377 A | * | 3/1998 | Torii | 438/303 |
| 5,814,537 A | * | 9/1998 | Maa et al. | 438/151 |
| 5,904,533 A | * | 5/1999 | Lin | 438/299 |
| 5,970,380 A | * | 10/1999 | Lee | 438/682 |
| 5,972,785 A | * | 10/1999 | Shishiguchi et al. | 438/592 |
| 6,060,387 A | * | 5/2000 | Shepela et al. | 438/630 |
| 6,063,681 A | * | 5/2000 | Son | 438/303 |
| 6,110,811 A | * | 8/2000 | Pey | 438/592 |
| 6,140,232 A | * | 10/2000 | Lin et al. | 438/664 |
| 6,156,649 A | * | 12/2000 | Hause et al. | 438/655 |
| 6,211,016 B1 | * | 4/2001 | Wu | 438/264 |

* cited by examiner

*Primary Examiner*—Tom Thomas
*Assistant Examiner*—Lex H. Malsawma

(57) ABSTRACT

A silicide gate contact is formed which is relatively thicker than silicide contacts formed over source/drain regions and shallow junction extensions. A metal layer is first deposited to form silicide over the polysilicon gate and the source/drain extension regions. The silicide is removed from the extension regions, forming shallow junctions, and a layer of silicide remains on the polysilicon gate. A second metal deposition step and silicidation step forms silicide contacts over the source/drain regions and the polysilicon gate. The resulting silicide gate contact is thicker than the resulting silicide contacts over the source/drain regions.

18 Claims, 8 Drawing Sheets

DOUBLE SILICIDE FORMATION IN POLYSICON GATE WITHOUT SILICIDE IN SOURCE/DRAIN EXTENSIONS

RELATED APPLICATIONS

This application contains subject matter similar to that disclosed in U.S. patent application Ser. No. 09/780,474, filed on Feb. 1, 2002.

FIELD OF THE INVENTION

The present invention relates to semiconductor fabrication, and in particular to forming silicide contacts on a semiconductor device.

BACKGROUND OF THE INVENTION

The semiconductor industry is continually striving to improve the performance of metal-oxide-semiconductor (MOS) devices. The ability to create devices with sub-micron features has allowed significant performance increases, due to a resulting decrease in the resistances and parasitic capacitances that adversely affect performance. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOS structures.

In addition to the contributions supplied by these advances in MOS processing disciplines, performance improvements have also been obtained through use of a salicide process (Self-ALIgned-siliCIDE). Salicide technology comprises forming silicide layers on the source/drain regions and/or on the gate electrode in a self-aligned manner. Salicide technology is improving the performance characteristics of semiconductor devices, and is becoming an essential component of semiconductor device fabrication. As gate electrode lengths are scaled down, the source/drain junctions and polycrystalline line width must also be scaled down. However, scaling down the source/drain junctions and polycrystalline line width increases parasitic resistance in the source/drain diffusion layers and gate electrode diffusion layer, and also increases the sheet and contact resistance of the gate electrode and source/drain regions. Salicide technology reduces parasitic, sheet, and contact resistance in the source/drain diffusion layers and the gate electrode diffusion layer that results from this scaling down of the source/drain junctions and polycrystalline line width.

Silicides are typically formed by reacting a metal with crystallized silicon (Si) within a specified temperature range for a specific period of time. Silicide layers may be self-aligned by different techniques. For example, selectively depositing the metal on the top of the gate electrode and on the source/drain regions of a semiconductor device prior to an annealing process causes only the Si of the source/drain regions and the top of the gate electrode to form silicide upon annealing. Alternatively, sidewall spacers, on the sides of the gate electrode, constructed of a material that does not react with the metal layer, allow a blanket layer of metal to be deposited over a semiconductor device while restricting silicide formation to the exposed source/drain regions and the top of the gate electrode during an annealing process. During the annealing process, the semiconductor device is heated to a reaction temperature, and held at the reaction temperature for a period of time, causing the metal layer to react with the crystallized Si that the metal contacts, thus forming a silicide layer interfacing with the remaining crystallized Si substrate of the source/drain regions and/or the gate electrode. Multiple annealing steps may be employed. Various metals react with Si to form a silicide, however, titaniumn (Ti) and cobalt (Co) are currently the most common metals used to create silicides when manufacturing semiconductor devices utilizing salicide technology. Recently, attention has turned towards using nickel to form NiSi utilizing salicide technology. Using NiSi is advantageous over using $TiSi_2$ and $CoSi_2$ because many limitations associated with $TiSi_2$ and $CoSi_2$ are avoided. When forming NiSi, a low resistivity phase is the first phase to form, and does so at a relatively low temperature. Additionally, nickel (Ni), like Co, diffuses through the film into Si, unlike Ti where the Si diffuses into the metal layer. Diffusion of Ni, and Co, through the film into Si prevents bridging between the silicide layer on the gate electrode and the silicide layer over the source/drain regions. The reaction that forms NiSi requires less Si than when $TiSi_2$ and $CoSi_2$ are formed. Nickel silicide exhibits almost no linewidth dependence of sheet resistance. Nickel silicide is normally annealed in a one step process, versus a process requiring an anneal, an etch, and a second anneal, as is normal for $TiSi_2$ and $CoSi_2$. Nickel silicide also exhibits low film stress, i.e., causes less wafer distortion.

As shown in FIG. 1, a typical semiconductor device, a metal oxide semiconductor field effect transistor (MOSFET), includes a polysilicon gate 100 and an insulating gate oxide layer 110 formed over silicon substrate 120. Deep source/drain regions 140 (sometimes referred to as heavily doped source and drain regions) and source/drain extension regions 150 (sometimes referred to as lightly doped source and drain regions or LDDs) are formed in substrate 120, such as by ion implantation. Typically, once the source/drain extension regions 150 are formed, oxide spacers are formed abutting the gate 100 to protect the source/drain extension regions from further doping while additional ion implantation is performed to form the deep source/drain regions 140. The source/drain extension 150 and deep source/drain 140 are annealed (heated) following ion implantation to obtain the desired material characteristics and to activate the dopants. Generally, doped regions are regions containing a higher concentration of p-type or n-type dopants than the substrate. Also, silicide regions 170 and 160 are typically formed on, over, or within the polysilicon gate 100 and the source/drain regions 140, respectively.

Source/drain extension regions 150 generally have a lower concentration of dopants compared to deep source/drain regions 140, although extension regions 150 are increasingly being endowed with dopant concentrations approaching that of the deep source/drain regions 140. Source/drain extension regions 150 possess a thickness $T_1$ smaller than a corresponding thickness $T_2$ of deep source/drain regions 140. The shallow source/drain extension regions 150 are important, for example, in reducing hot carrier injection (HCI) which often occurs in scaled down (e.g., sub-micron) devices and in reducing short channel effects. For adequate suppression of short channel effects (SCE), the depth of the source drain extension regions should be less than about 700 Å and preferably less than about 500 Å and still more preferably less than 300 Å.

A conventional process for forming the MOSFET shown in FIG. 1 is illustrated in FIGS. 2A–2G. Such a process begins with a substrate 200 upon which is deposited or grown an oxide or other insulating layer. A polysilicon layer or layer of other conducting material is formed over the oxide layer followed by patterning and etching to form gate oxide 205 and polysilicon gate 210, as shown in FIG. 2A. Source/drain extension regions 220 are then formed as shown in FIG. 2B, generally by ion implantation with boron, arsenic, or phosphorous ions at energy levels in the range of 1–100 keV. Some processes perform an anneal step following this step to activate doped extension regions 220. Following formation of source/drain extension regions 220, spacers 230 are formed abutting the gate 210 to protect the underlying source/drain extension regions from subsequent implantation used to form the deep source/drain regions 240. The spacers are typically formed by depositing an oxide layer over the entire wafer, including the substrate and gate, by chemical vapor deposition (CVD) or other well-known method followed by anisotropic etching of the oxide to form the spacers 230, as shown in FIG. 2C.

Once spacers 230 are in place, heavily doped source and drain regions (deep source/drain regions) 240 are formed, usually by ion implantation at an energy in the range of 20–120 keV, as shown in FIG. 2D. FIG. 2E shows an anneal (heating) step, wherein the curved lines represent heating of the structure. Annealing reforms the substrate lattice structure and electrically activates the doped regions 220 and 240. Annealing typically is done at temperatures above 900° C. and is often performed at temperatures above 1000° C. This annealing is rapidly performed, typically lasting for only about 1–60 seconds depending on the particular temperatures used and objects to be achieved, as known to those skilled in the art.

In FIG. 2F, a metal layer 250 is deposited over the source/drain regions 240, the gate structure 210, and sidewall spacers 230. The metal layer 250 can be deposited by a PVD method such as sputtering or evaporation, or a CVD method; and is deposited to a thickness of about 100 Å to about 500 Å. The deposited metal layer 250 is subsequently annealed in a rapid thermal anneal step to form metal silicide contacts 260 and 270, as shown in FIG. 2G. Nickel silicide, for example, is formed by annealing for about 15 to 120 seconds at between 350° C. to 700° C.

The thickness of the silicide 260 on the polysilicon gate 210 affects the gate's resistance and, therefore, the device's speed. Typically, device performance improves as the gate silicide 260 is made thicker. However, accompanying a thicker gate silicide layer 260 is thicker silicide formation on the source/drain regions 240, which can lead to detrimental effects on a device's performance. In addition to the silicide layer 270 that forms on the source/drain regions 240, some silicide forms within the source/drain regions 240 and in the source/drain extensions 220. The presence of silicide in the source/drain regions 240 and the extension regions 220 can contribute to unwanted short channel effects, such as junction leakage. More silicide is likely to be formed in the source/drain regions 240 and the extension regions 220 as the thickness of the desirable silicide layer 270 is increased. The device's performance is also affected by the thickness of the source/drain regions 240 and extension regions 220. When the thicknesses of these regions 220 and 240 are reduced to improve a device's performance, the amount of excess silicide formation in these regions 220 needed to adversely affect the device (by creating junction leakage) is also reduced.

Accordingly, there exists a need for salicide technology that enables a relatively thick silicide layer to be formed on a polysilicon gate while controlling the thickness of the silicide layer on the source/drain regions and the source/drain extension regions.

SUMMARY OF THE INVENTION

These and other needs are met by embodiments of the present invention, which provide a method for forming silicide contacts with two separate metal deposition steps and accompanying silicide formation steps. According to this method, a metal silicide layer is formed over particular regions of a substrate and then selectively removed from some of those regions. A second metal silicide layer is subsequently formed over the particular regions of the substrate and used as metal silicide contacts for the device.

One aspect of the present invention relates to a semiconductor device that includes a substrate with a polysilicon gate and source/drain regions formed on top. A silicide contact is included on the polysilicon gate that is about 5 to 8 times thicker than the silicide contacts on the source/drain regions.

Another aspect of the present invention relates to a method of manufacturing silicide contacts on a semiconductor device that includes forming a gate on a semiconductor substrate, forming at least one source/drain extension region on the substrate, annealing a first deposited metal layer to form metal silicide, removing the metal silicide over the source/drain extension regions while removing only a portion of the silicide over the polysilicon gate, and annealing a second deposited metal layer to form silicide contacts on both the polysilicon gate and the source/drain extension regions.

One further aspect of the present invention relates to a method for forming silicide contacts on a polysilicon gate and source/drain regions that includes the steps of forming silicide on the gate and source/drain regions by annealing a first metal layer, removing a portion of the silicide on the gate and removing substantially all the silicide on the source/drain regions, and then forming the silicide contacts on the gate and source/drain regions by annealing a second metal layer.

Additional advantages and other features of the present invention will be set forth in part in the description which follows, and in part will become apparent to those having ordinary skill in the art upon examination of the following, or may be learned by practice of the invention. The advantages of the present invention may be realized and attained as particularly pointed out in the appended claims The term semiconductor devices, as used herein, is not limited to the specifically disclosed embodiments. Semiconductor devices, as used herein, include a wide variety of electronic devices including transistors, capacitors, microprocessors, random access memories, etc. In general, semiconductor devices refer to any electrical device comprising semiconductors.

DETAILED DESCRIPTION OF THE PREFERRED EMBODIMENTS

The present invention addresses and solves problems encountered by conventional methods of forming metal silicide contacts in polysilicon gates, in source/drain regions and in shallow source/drain extension regions.

Figure 1:
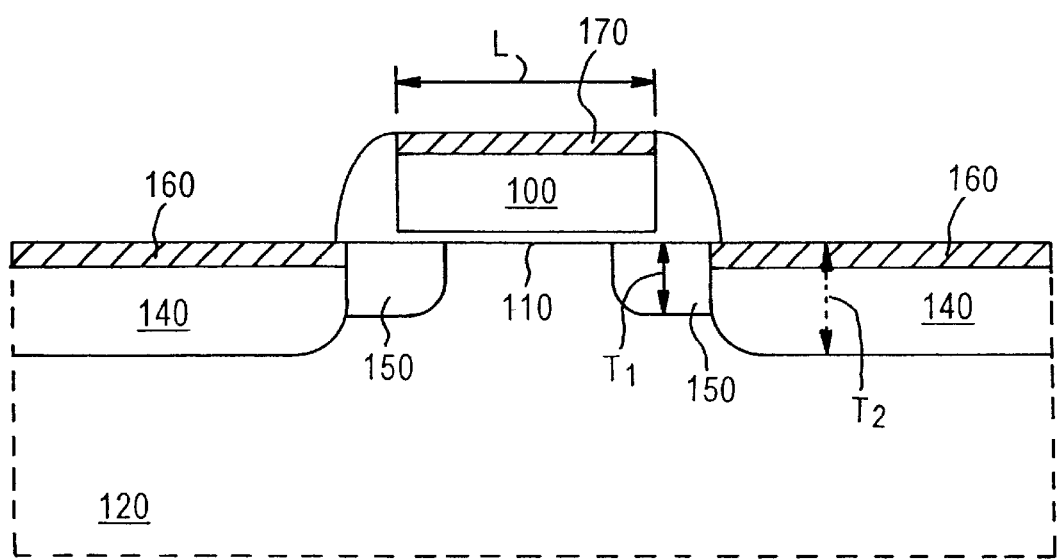
FIG. 1 shows a conventional MOSFET semiconductor device.
Figure 2A:
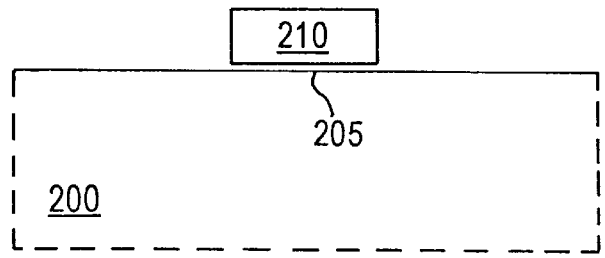
FIGS. 2A–2G are cross sectional views showing various stages in the formation of the semiconductor device depicted in FIG. 1.
Figure 2B:
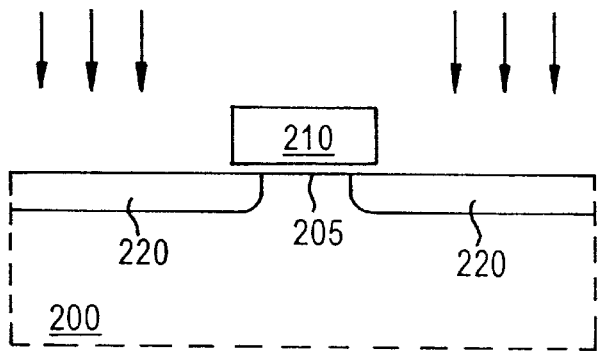
Figure 2C:
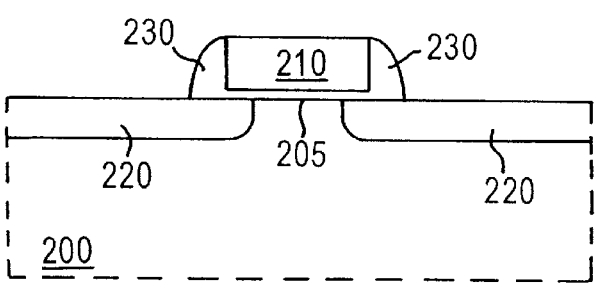
Figure 2D:
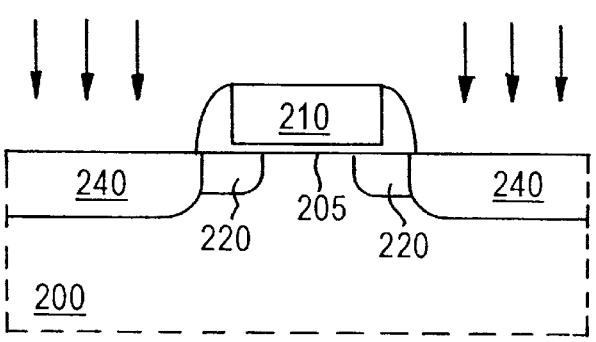
Figure 2E:
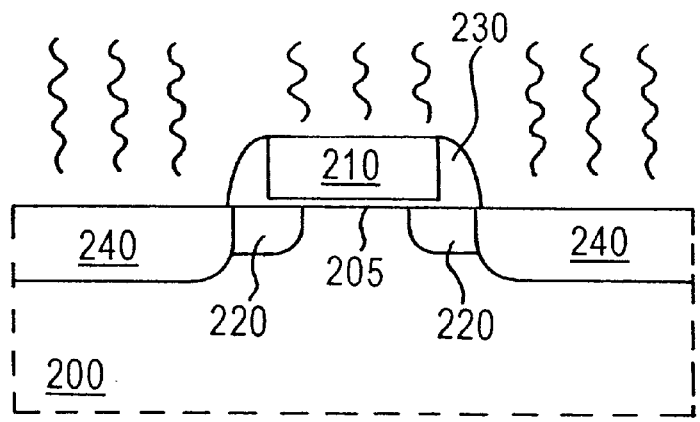
Figure 2F:
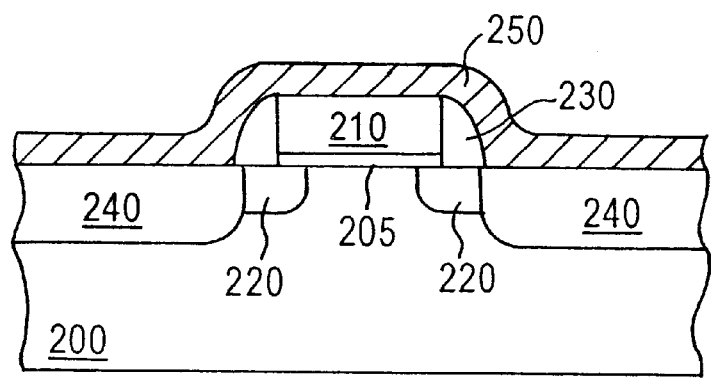
Figure 2G:
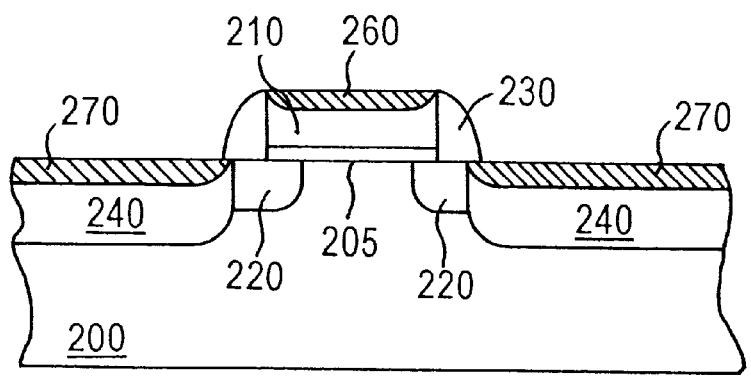
Figure 3A:
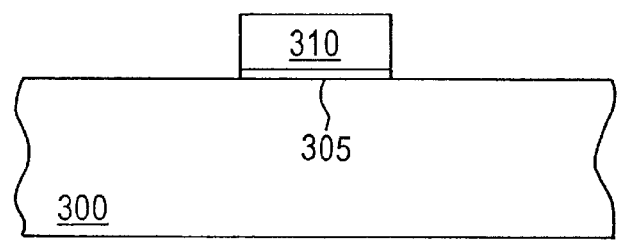
FIGS. 3A–3M are cross-sectional views showing various stages in the formation of the semiconductor device in accord with a first aspect of the invention.
Figure 3B:
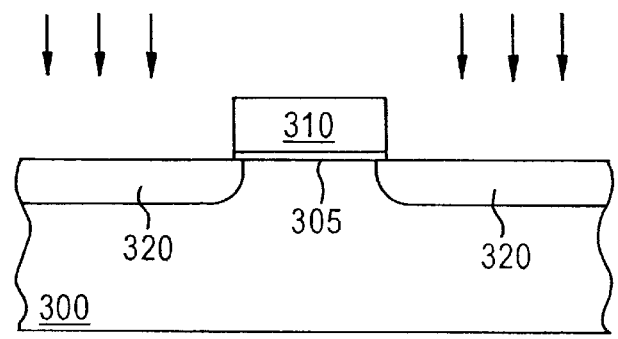
Figure 3C:
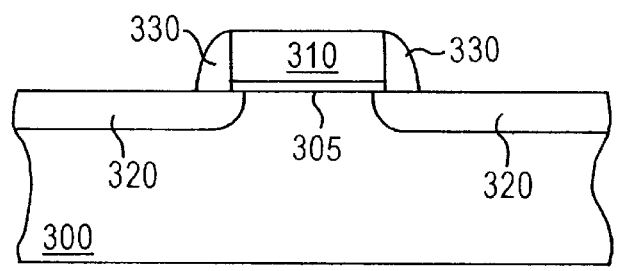
Figure 3D:
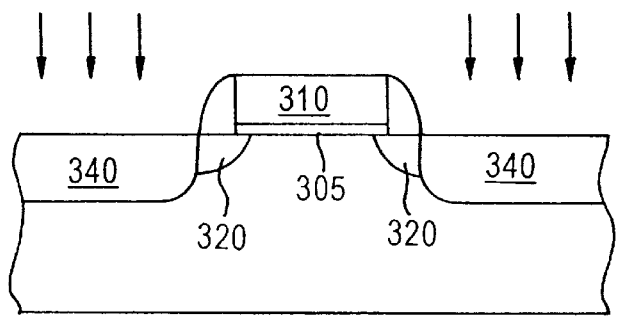
Figure 3E:
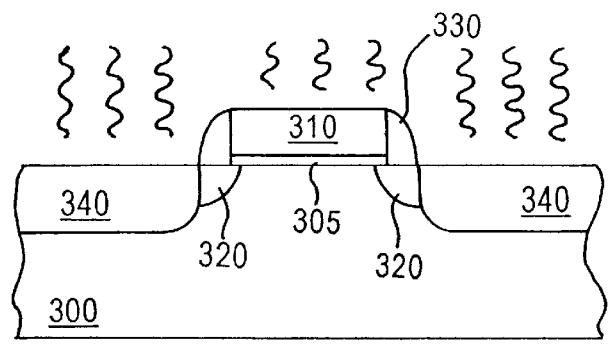

Referring to FIGS. 3A through 3G, the early stages of a transistor structure are formed in a conventional manner such as that described earlier. Substrate 300, in FIG. 3A, is doped with an impurity (eg., an n-type impurity), a gate oxide 305 and polysilicon gate 310 are formed, and, as shown in FIG. 3B, source/drain extension regions 320 are formed using the gate 310 as a mask by implanting another type of impurity (e.g., p-type impurity) at an energy level between about 1–10 keV with a dose between about $1 \times 10^{14}$ to $2 \times 10^{15}$ cm$^{-2}$, such as by ion implantation. Sidewall spacers 330, each with a thickness that ranges from about 700 Å to about 1200 Å, are formed abutting the gate 310, as illustrated in FIG. 3C. The spacers 330 are comprised of any suitable dielectric material such as silicon dioxide, silicon nitride, or silicon oxynitride. Once the spacers 330 are in place, heavily doped source and drain regions 340, as shown in FIG. 3D, are formed followed by annealing (see FIG. 3E).

Figure 3F:
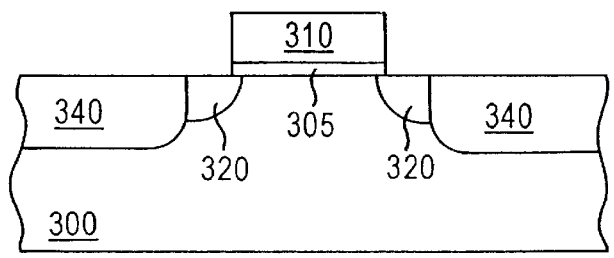

After annealing, the sidewall spacers 330 are removed from the structure, as shown in FIG. 3F, typically by etching. In one embodiment, the spacers 330 are etched-off by a wet clean method with the wet etch chemistry varying based on the material of the spacers 330. For nitride spacers, phosphoric acid is typically used and for oxide spacers, HF diluted with water is conventionally used.

Figure 3G:
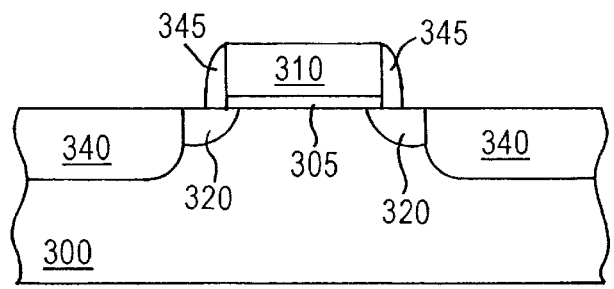

The etched-off sidewall spacers 330 are replaced with thinner sidewall spacers 345, as illustrated in FIG. 3G, that range in thickness freon about 10 Å to about 200 Å. The spacers 345 can be formed in the conventional manner, described earlier, by performing CVD of an oxide, or other dielectric, layer followed by an anisotropic etching step.

Figure 3H:
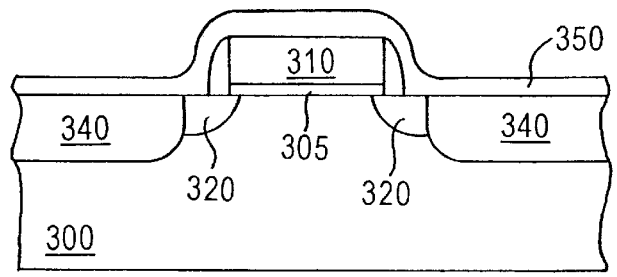
Figure 3I:
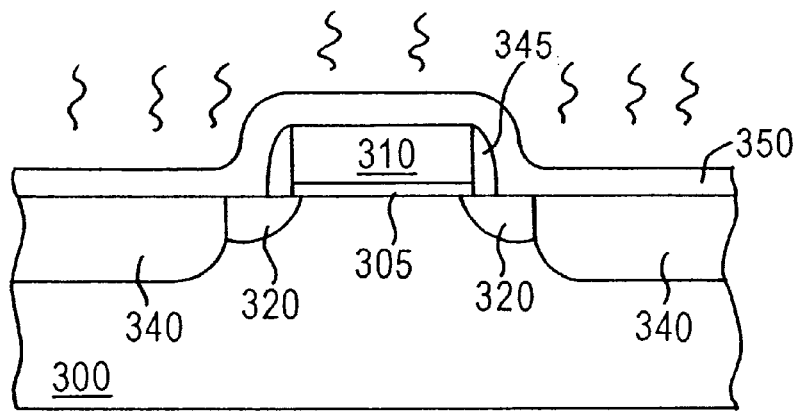

In to FIG. 3H, a layer of metal 350, which is preferably Ni, is deposited over the surface of the substrate 300, gate 310, spacers 345 and source/drain regions 320 and 340. While other metal layers such as titanium and cobalt can also be used, the following description assumes the use of a nickel layer 350. The nickel layer 350 deposition can be effected in any conventional manner. The structure is then annealed, in FIG. 3I, at a temperature between a range of 280° C.–700° C., wherein the lower limit is the temperature at which Ni begins to react with silicon. More preferably, annealing is conducted at a temperature between about 400° C.–600° C. The anneal duration varies in accord with the anneal temperature, among other factors, and lasts for about 5–30 seconds, although a range of 1–60 seconds is acceptable.

It has been observed that, during formation of NiSi, as the Ni diffuses into the Si and forms NiSi, the advancing NiSi forces dopants out of occupied Si and causes the dopant to accumulate or pile up in the Si near the NiSi/Si interface. Formation of $CoSi_2$ produces a similar, but attenuated, reaction. The present invention advantageously incorporates this observed phenomena to form shallow source/drain extension regions having a depth less than about 700 Å in accord with present design requirements and to form silicide contacts over the source/drain areas that are thinner than the silicide contact formed over the polysilicon gate.

Figure 3J:
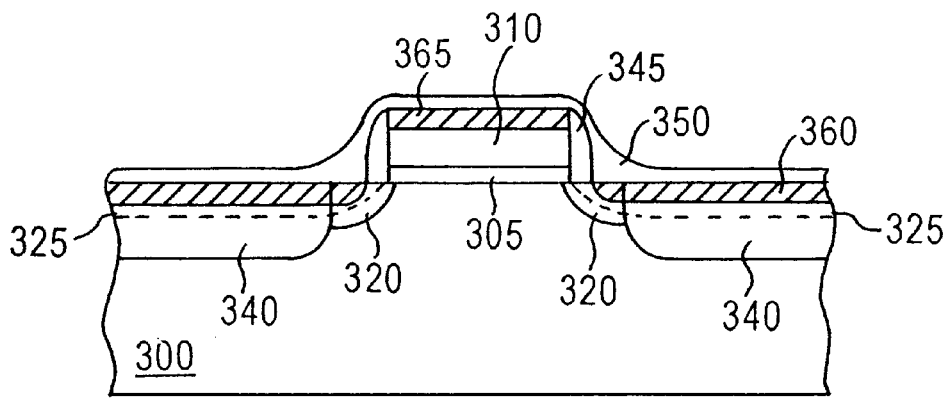

The annealing process forms NiSi 360 over source/drain regions 320 and 340 to a depth between about 200–400 Å, forcing the dopant into the source/drain regions 320 and 340 and causing a dopant pile up 325 (i.e., increased dopant concentration) at the NiSi/Si interface region, as shown in FIG. 3J. For relatively wide polysilicon gate line widths, NiSi is formed on the gate 310 at the same rate as in the active regions 320 and 340. However, as the gate line width is decreased, the rate of NiSi formation on the gate 310 is increased due to nickel reacting with both the side surfaces and the top surface of the gate 310. During formation of the sidewall spacers 345, the tops of the spacers 345 do not form precisely flush with the top surface of the polysilicon gate 310 and a small portion of the side surfaces of the polysilicon gate 310 remains exposed to react with the deposited nickel to form NiSi. At a gate line width of approximately 1000 Å, NiSi forms on the polysilicon gate at about 2.5 to 3 times the rate that NiSi forms on the active regions. As a result, tie NiSi layer 365 has a thickness of between about 600 Å and about 1200 Å.

Figure 3K:
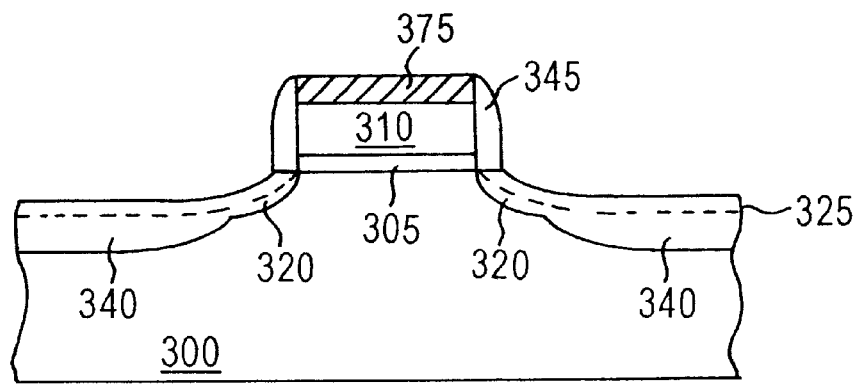

Following formation of the NiSi 360 to a desired depth, any unreacted nickel 350 and the NiSi 360 over the source/drain regions 320 and 340 is removed, as shown in FIG. 3K. The NiSi 360 may be advantageously removed, for example, by etching using an appropriate etchant, such as APM (ammonium hydroxide-peroxide mix), leaving behind a thinner portion of the source/drain extension region comprising Si with the dopant pile up 325 at the NiSi/Si interface region. The removal of the NiSi 360 also results in removal of some of the NiSi from the gate's NiSi layer 365. However, because the NiSi layer 365 was formed thicker than the NiSi layers 360, a NiSi layer 375 of approximately 400 to 800 Å remains on the polysilicon gate 310.

Figure 3L:
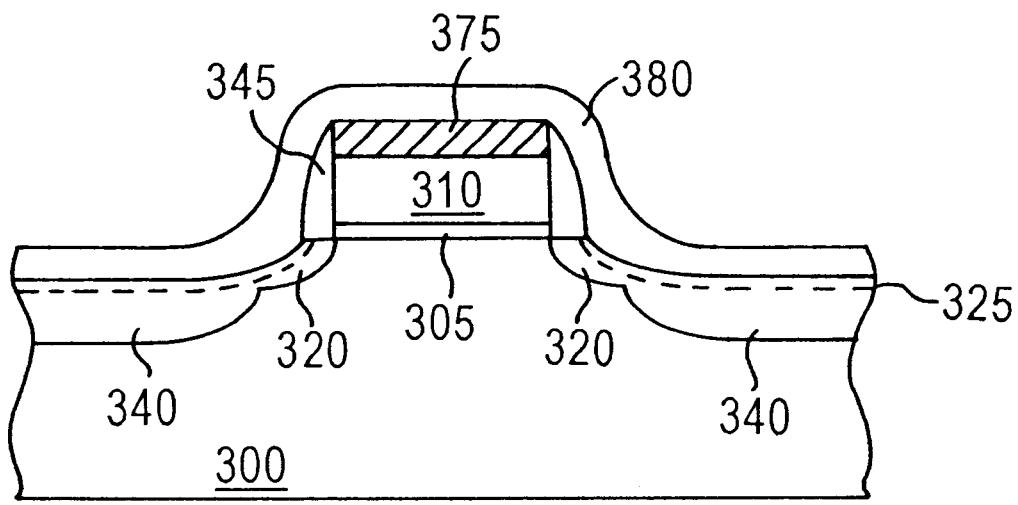
Figure 3M:
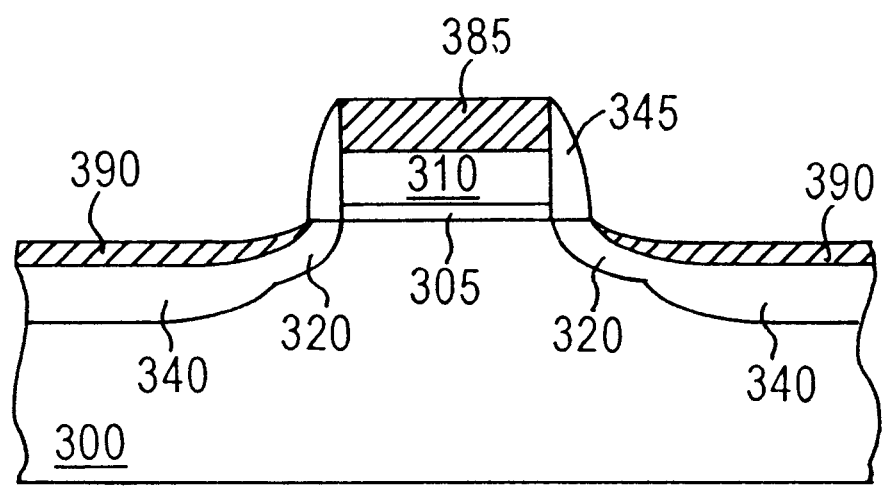

As shown in FIG. 3L, a second metal layer 380, preferably comprising nickel, is deposited over the regions of the device. This second metal layer 380 can be deposited using similar methods as earlier but is deposited with a thickness of between approximately 20 Å and approximately 100 Å. Similar to the previously described silicidation step, an annealing is performed to form silicide layers 385 and 390, as shown in FIG. 3M. The NiSi layer 385 aver the gate 310 forms to a thickness of between about 150 Å and about 600 Å and the NiSi layers 390 over the source/drain regions 320 and 340 form to a thickness of between about 50 Å and about 206 Å. Any unreacted metal from layer 380 is etched away, in a conventional manner that is selective to the unreacted nickel relative to the nickel silicide, to form the device depicted in FIG. 3M. The relatively thick silicide gate contact 385 is formed by the combination of the two metal deposition steps and accompanying silicidation steps. The relatively thin silicide source/drain contacts are formed only by the latter metal deposition and silicidation steps. In comparison, the silicide gate contact 385 has a thickness that is about 5 to 8 times the thickness of the silicide source/drain contacts. As a result, the introduction of silicide into the source/drain regions 340 and source/drain extension regions 320 is minimized while still maintaining the formation of a thick gate contact 385.

Accordingly, a semiconductor device has been shown, according to the present inventive methodology, that has a gate silicide contact of sufficient thickness to provide desired performance benefits but with thinner source/drain silicide contacts that do not contribute to the formation of undesirable silicide in the source/drain regions and source/drain extension regions that can increase the likelihood of junction leakage and short channel effects.

Figure 4:
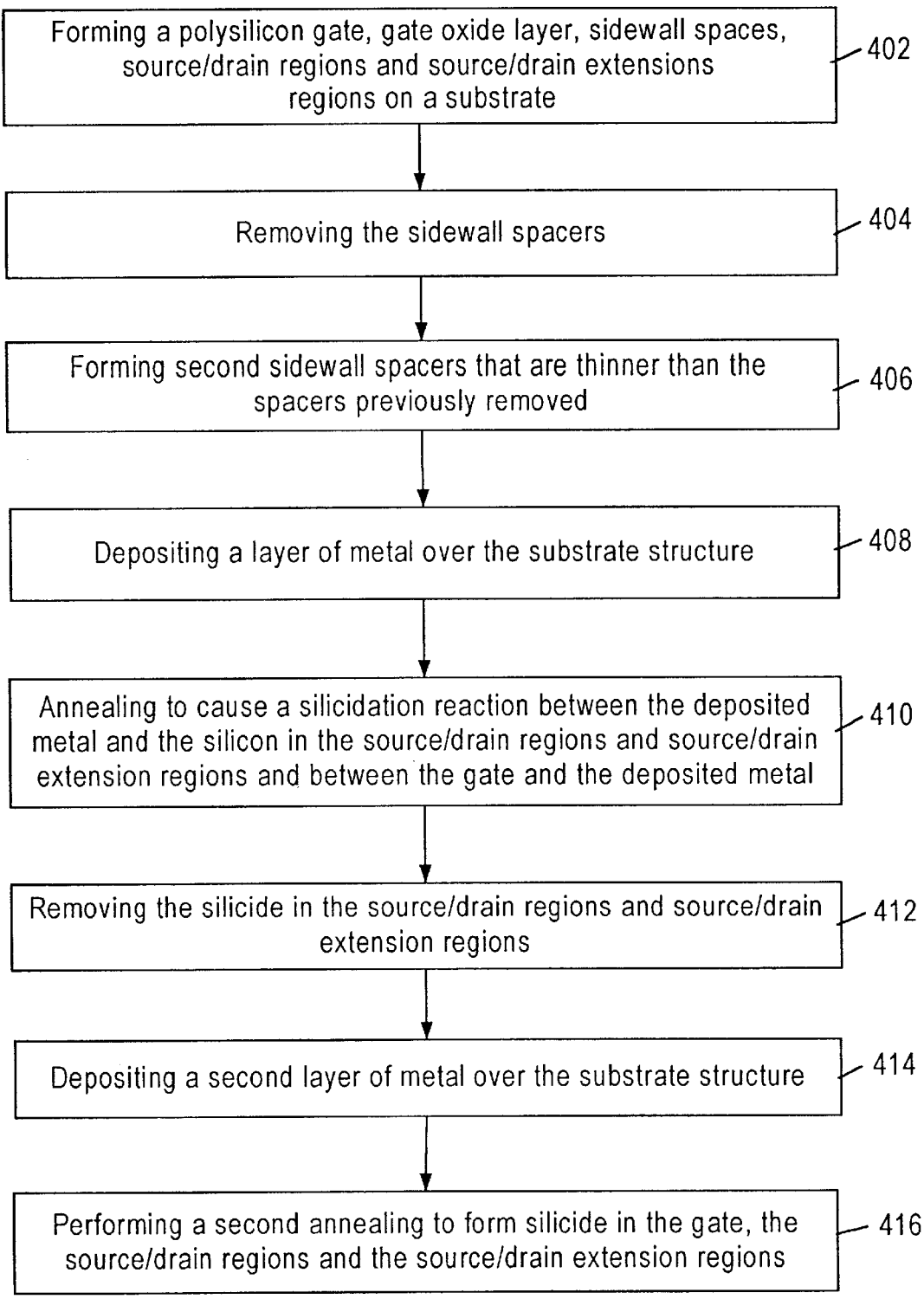
FIG. 4 is a block diagram of a method in accord with the first aspect of the invention

Certain aspects of the above process are summarized in the flowchart depicted in FIG 4. In step 402, impurity regions, the polysilicon gate and the sidewall spacers are formed on a substrate. In step 404, the sidewall spacers are removed. A second pair of thinner sidewall spacers are then formed, in step 406, on the remaining structure. In step 408, a metal layer is deposited and is then annealed in step 410 at a temperature sufficient to effect a silicidation reaction between the deposited metal and the silicon in the source/drain regions and the source/drain extension regions of the silicon substrate to form a dopant pile up at the silicide/Si substrate interface. The deposited metal also reacts with the silicon in the polysilicon gate. The silicide is etched away in step 412, leaving behind a portion of the source/drain extension region comprising Si with the dopant pile up, thereby forming a shallow junction. Also left behind is a layer of silicide formed on the polysilicon gate. Next, in step 414, a second layer of metal is deposited over the structure and annealed, in step 416, to form silicide contacts; the silicide contacts over the source drain regions being thinner than the silicide contact over the polysilicon gate. These steps are merely illustrative and are not intended to encompass every aspect of the method of the invention defined by the appended claims.

In accord with the invention, formation of silicide contacts for semiconductor devices having a design rule in the deep-submicron range is enabled while undesirable consequences resulting therefrom, such as short channel effects and junction leakage, are substantially prevented. Accordingly, the present invention achieves the technological advantage of enabling both the formation of reliable gate silicide contacts and the formation of silicide contacts within ultra-shallow source/drain junctions to meet the increasing demands for high density and miniaturization. The present invention is applicable to the manufacture of various types of semiconductor devices, particularly semiconductor devices having a design rule of less than about 0.18 microns.

In the previous description, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only preferred embodiments of the invention and but a few examples of their versatility are shown and described in the present disclosure. It is to be understood that the invention is capable of use in various other combinations and environments and is capable of changes or modifications within the scope of the inventive concept as expressed herein.

What is claimed is:

1. A method of forming silicide contacts on a polysilicon gate and source/drain regions of a semiconductor device, comprising the steps of:

forming silicide on a polysilicon gate and on source/drain regions by annealing a first metal layer;

removing a portion of the silicide formed on the polysilicon gate;

removing substantially all of the silicide formed on the source/drain regions; and forming silicide contacts on the source/drain regions and additional silicide on the polysilicon gate by annealing a second metal layer.

2. The method according to claim 1, wherein both silicide removing steps are performed simultaneously.

3. The method according to claim 2, wherein both silicide removing steps comprise etching.

4. The method according to claim 1, wherein the combined thickness of the silicide formed on the polysilicon gate is about 5 to 8 times the thickness of the silicide contacts formed on the source/drain regions.

5. The method according to claim 1, wherein the combined thickness of the silicide formed on the polysilicon gate is between 400 Å and about 1400 Å.

6. The method according to claim 1, wherein the thickness of the silicide contacts formed of the source/drain regions is between about 50 Å and about 200 Å.

7. The method according to claim 1, wherein the first and second metal layers are the same and comprise one of Ni, Co, and Ti.

8. A method of manufacturing silicide contacts on a semiconductor device, comprising the steps of:

providing a semiconductor substrate;

forming a polysilicon gate on the semiconductor substrate;

forming at least one source/drain region on the substrate;

depositing a first refractory metal layer over the substrate;

annealing the first metal layer to form silicide on the polysilicon gate and each of the source/drain regions;

removing the silicide, wherein the silicide on each of the source/drain regions is substantially entirely removed and the silicide on the polysilicon gate is partly removed;

depositing a second refractory metal layer over the substrate; and annealing the second metal layer to form silicide contacts on each of the source/drain regions and additional silicide on the polysilicon gate.

9. The method according to claim 8, wherein the first refractory metal comprises one of Ni, Ti and Co.

10. The method according to claim 9, wherein the first refractory metal and the second refractory metal are the same metal.

11. The method according to claim 1, wherein the step of forming the at least one source/drain region includes the step of:

implanting ions of an impurity at an energy level between about 1 keV and about 10 keV.

12. The method according to claim 11, wherein the step of implanting is performed with a dose between about $1\times10^{14}$ cm$^{-2}$ to about $2\times10^{15}$ cm$^{-2}$.

13. The method according to claim 1, wherein the first refractory metal layer is deposited to a thickness of between about 50 Å and about 150 Å.

14. The method according claim 1, wherein the second refractory metal layer is deposited to a thickness of between about 20 Å and about 100 Å.

15. The method according to claim 1, wherein the silicide contact formed on the polysilicon gate has a thickness of about 5 to 8 times the thickness of the silicide contacts formed on each of the at least one source/drain regions.

16. The method according to claim 1, wherein the silicide contact formed on the polysilicon gate has a thickness of between about 400 Å and about 1400 Å.

17. The method according to claim 1, wherein each of the silicide contacts formed on the at least one source/drain region has a thickness of between about 50 Å and about 200 Å.

18. The method according to claim 1, wherein the step of removing the silicide is performed by etching.

* * * * *

UNITED STATES PATENT AND TRADEMARK OFFICE
CERTIFICATE OF CORRECTION

PATENT NO.    : 6,451,693 B1                                                         Page 1 of 1
DATED         : September 17, 2002
INVENTOR(S)   : Christy Mei-Chu Woo et al.

It is certified that error appears in the above-identified patent and that said Letters Patent is hereby corrected as shown below:

<u>Title page, Item [54] and Column 1, line 2,</u>
Please replace "POLYSICON" with -- POLYSILICON --

The Title should appear as:
-- DOUBLE SILICIDE FORMATION IN POLYSILICON GATE WITHOUT SILICIDE IN SOURCE/DRAIN EXTENSIONS --

Signed and Sealed this

Twenty-ninth Day of April, 2003

JAMES E. ROGAN
*Director of the United States Patent and Trademark Office*